(12) United States Patent
Nandan et al.

(10) Patent No.: US 9,612,054 B2
(45) Date of Patent: Apr. 4, 2017

(54) METHODS OF ADJUSTING INSULATION IN A DIRECTIONAL SOLIDIFICATION FURNACE

(71) Applicant: MEMC Singapore Pte. Ltd. (UEN200614794D), Singapore (SG)

(72) Inventors: Rituraj Nandan, O'Fallon, MO (US); Benjamin Michael Meyer, Definance, MO (US); Lee William Ferry, St. Charles, MO (US)

(73) Assignee: MEMC Singapore Pte. Ltd. (UEN200614794D), Singapore (SG)

( * ) Notice: Subject to any disclaimer, the term of this patent is extended or adjusted under 35 U.S.C. 154(b) by 763 days.

(21) Appl. No.: 13/763,240

(22) Filed: Feb. 8, 2013

(65) Prior Publication Data

US 2013/0167591 A1    Jul. 4, 2013

Related U.S. Application Data

(60) Continuation of application No. 13/532,096, filed on Jun. 25, 2012, now Pat. No. 8,784,561, which is a division of application No. 13/077,068, filed on Mar. 31, 2011, now abandoned.

(51) Int. Cl.

| | | |
|---|---|---|
| *C30B 35/00* | (2006.01) | |
| *F27D 1/00* | (2006.01) | |
| *C30B 29/06* | (2006.01) | |
| *C30B 11/00* | (2006.01) | |
| *F27B 14/10* | (2006.01) | |

(52) U.S. Cl.
CPC .......... *F27D 1/0033* (2013.01); *C30B 11/003* (2013.01); *C30B 29/06* (2013.01); *F27B 14/10* (2013.01); *Y10T 29/49718* (2015.01)

(58) Field of Classification Search
CPC ..... C30B 11/002; C30B 11/003; C30B 35/02; C30B 29/06
USPC .......................... 117/200, 206, 217, 218, 222
See application file for complete search history.

(56) References Cited

U.S. PATENT DOCUMENTS

| | | |
|---|---|---|
| 4,015,657 A | 4/1977 | Petrov et al. |
| 4,251,206 A | 2/1981 | Berkman et al. |
| 4,764,195 A | 8/1988 | Allaire et al. |

(Continued)

FOREIGN PATENT DOCUMENTS

| | | |
|---|---|---|
| DE | 4236827 A1 | 5/1994 |
| GB | 2041236 A | 9/1980 |

(Continued)

OTHER PUBLICATIONS

PCT International Search Report and Written Opinion of the International Searching Authority mailed on Jul. 8, 2011 regarding PCT/IB2011/050392 filed on Jan. 28, 2011; 20 pages.

(Continued)

*Primary Examiner* — Matthew Song
(74) *Attorney, Agent, or Firm* — Armstrong Teasdale LLP

(57) ABSTRACT

Methods are disclosed for inhibiting heat transfer through lateral sidewalls of a support member positioned beneath a crucible in a directional solidification furnace. The methods include the use of insulation positioned adjacent the lateral sidewalls of the support member. The insulation inhibits heat transfer through the lateral sidewalls of the support member to ensure the one-dimensional transfer of heat from the melt through the support member.

16 Claims, 5 Drawing Sheets

(56) References Cited

U.S. PATENT DOCUMENTS

| | | |
|---|---|---|
| 6,200,385 B1 | 3/2001 | Swinehart |
| 7,442,255 B2 | 10/2008 | Einhaus et al. |
| 7,867,334 B2 | 1/2011 | Sakai |
| 2007/0227189 A1 | 10/2007 | Sakai |
| 2007/0283882 A1* | 12/2007 | Cho .................. C30B 11/002 |
| | | 117/204 |
| 2008/0292524 A1 | 11/2008 | Rancoule |
| 2009/0158993 A1 | 6/2009 | Sahr et al. |
| 2010/0083895 A1 | 4/2010 | Einhaus et al. |
| 2010/0209319 A1 | 8/2010 | Choi |
| 2011/0259316 A1 | 10/2011 | Pelletier et al. |
| 2012/0297580 A1 | 11/2012 | Dughiero et al. |

FOREIGN PATENT DOCUMENTS

| | | |
|---|---|---|
| GB | 2084978 A | 4/1982 |
| WO | 2007148985 A1 | 12/2007 |
| WO | 2007148987 A1 | 12/2007 |
| WO | 2009014961 A1 | 1/2009 |
| WO | 2010069784 A1 | 6/2010 |

OTHER PUBLICATIONS

PCT International Search Report and Written Opinion of the International Searching Authority mailed on May 23, 2012 regarding PCT/US2012/030942 filed on Mar. 28, 2012, 9 pages.

\* cited by examiner

METHODS OF ADJUSTING INSULATION IN A DIRECTIONAL SOLIDIFICATION FURNACE

CROSS-REFERENCE TO RELATED APPLICATION

This application is a continuation of U.S. application Ser. No. 13/532,096 filed Jun. 25, 2012 now U.S. Pat. No. 8,784,561, which is a divisional of U.S. application Ser. No. 13/077,068 filed Mar. 31, 2011, now abandoned, the entire disclosure of which is incorporated herein by reference in its entirety.

FIELD

This disclosure generally relates to directional solidification furnaces and, more specifically, to insulation systems and methods for directional solidification furnaces.

BACKGROUND

Directional solidification furnaces are used to produce multi-crystalline silicon ingots. During use of the furnace, raw silicon is first placed into a crucible disposed in the furnace. The raw silicon can take the form of solid chunks, recycled polysilicon, silicon dust, or a combination thereof. The crucible is typically constructed of quartz or another suitable material that can withstand high temperatures. The crucible is typically a five-sided box, with a lid placed over an open top of the box. The lid is typically not in direct contact with the box. The crucible is supported by a support structure that adds structural rigidity to the crucible.

The crucible is disposed within a containment vessel that forms part of the furnace. The containment vessel seals the crucible from the outside ambient environment. The pressure of the ambient atmosphere within the containment vessel is reduced after the crucible has been charged with silicon and sealed within the vessel. The content of the ambient atmosphere within the containment vessel can also be monitored and controlled.

The crucible and the charge are then heated to a temperature sufficient to melt the silicon. After the charge has completely melted, it is cooled at a controlled rate to achieve a directional solidification structure within the resulting ingot. The controlled rate of cooling is established by any combination of reducing the amount of heat applied by the heaters, movement of or the opening of a heat vent in insulation surrounding the crucible, or the circulation of a cooling medium through a cooling plate disposed adjacent the crucible. All of these methods results in the transfer of heat away from the crucible.

If the rate of cooling of the bottom of the crucible is greater than that of the sides of crucible (i.e., if the heat loss through the sides of the crucible is near zero), then a relatively flat, horizontal solidification isotherm is generated. The ingot thereby solidifies in the region closest to the cooler side of the crucible and proceeds in a direction away from the side of the crucible. The last portion of the melt to solidify is generally at the top of the ingot if a relatively flat, horizontal solidification isotherm was generated.

A concern in the production of multi-crystalline ingots is the rate of heat transfer from the melt during solidification. If a flat, horizontal solidification isotherm does not develop during solidification, different portions of the melt within the same plane can solidify at different times. This differential solidification of the ingot within the same plane can in turn lead to the formation of defects within the ingot.

This Background section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

BRIEF SUMMARY

One aspect of the present disclosure is a directional solidification furnace comprising a crucible for holding molten silicon, a crucible support supporting the crucible and transmitting heat therethrough, a support member, and an insulating member. The support member is in thermal communication with the crucible support and has an upper surface disposed adjacent the crucible support, a lower surface and lateral sidewalls. The insulating member is disposed adjacent the lateral sidewalls of the support member to insulate the lateral sidewalls such that heat is inhibited from exiting through the lateral sidewalls.

Another aspect of the present disclosure is a directional solidification furnace comprising a crucible for holding molten silicon, a crucible support for supporting the crucible, the crucible support having a lower surface, a support member, a main insulating member, and a secondary insulating member. The support member has an upper surface and a lower surface connected along their respective peripheries by lateral sidewalls that have a height. The lower surface of the crucible support is positioned adjacent the upper surface of the support member. The main insulating member is positioned adjacent the lateral sidewalls of the support member and has a height greater than or equal to the height of the lateral sidewalls of the support member. The main insulating member reduces the amount of heat transferred through the lateral sidewalls of the support member. The secondary insulating member is positioned atop the main insulating member and adjacent the crucible support. The secondary insulating member ensures a view factor is not present between the support member and other components of the directional solidification furnace.

Yet another aspect of the present disclosure is a directional solidification furnace comprising a crucible for holding molten silicon, a crucible support for supporting the crucible, the crucible support having a lower surface, a support member, and insulation. The support member has an upper surface and a lower surface connected along their respective peripheries by lateral sidewalls. The lower surface of the crucible support is positioned adjacent the upper surface of the support member. The insulation is positionable between a first position where the insulation is adjacent the lateral sidewalls of the support member and a second position where the insulation is disposed away from the lateral sidewalls of the support member.

Various refinements exist of the features noted in relation to the above-mentioned aspects. Further features may also be incorporated in the above-mentioned aspects as well. These refinements and additional features may exist individually or in any combination. For instance, various features discussed below in relation to any of the illustrated embodiments may be incorporated into any of the above-described aspects, alone or in any combination.

BRIEF DESCRIPTION OF THE DRAWINGS

Like reference symbols in the various drawings indicate like elements.

DETAILED DESCRIPTION

The embodiments described herein generally relate to systems for the insulation of portions of a directional solidification furnace. The furnace is used in the example embodiment for the production of multi-crystalline silicon. This silicon is used, for example, in the fabrication of photovoltaic modules for producing electricity. In other embodiments the furnace may be used to produce any other substance that be can melted and solidified in a directional solidification furnace. Examples of such materials include steel or alloys thereof.

Figure 1:
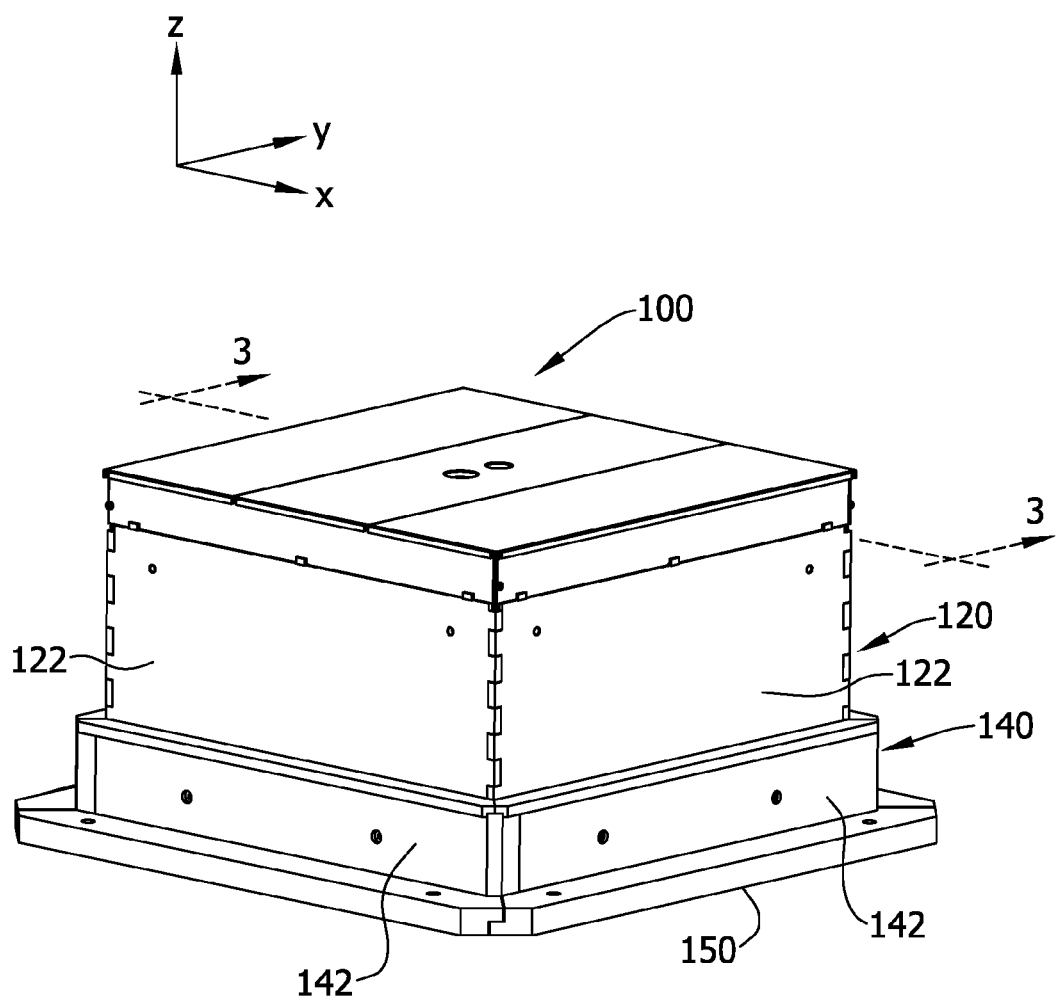
FIG. 1 is a perspective of a system for insulating a portion of a directional solidification furnace.
Figure 2:
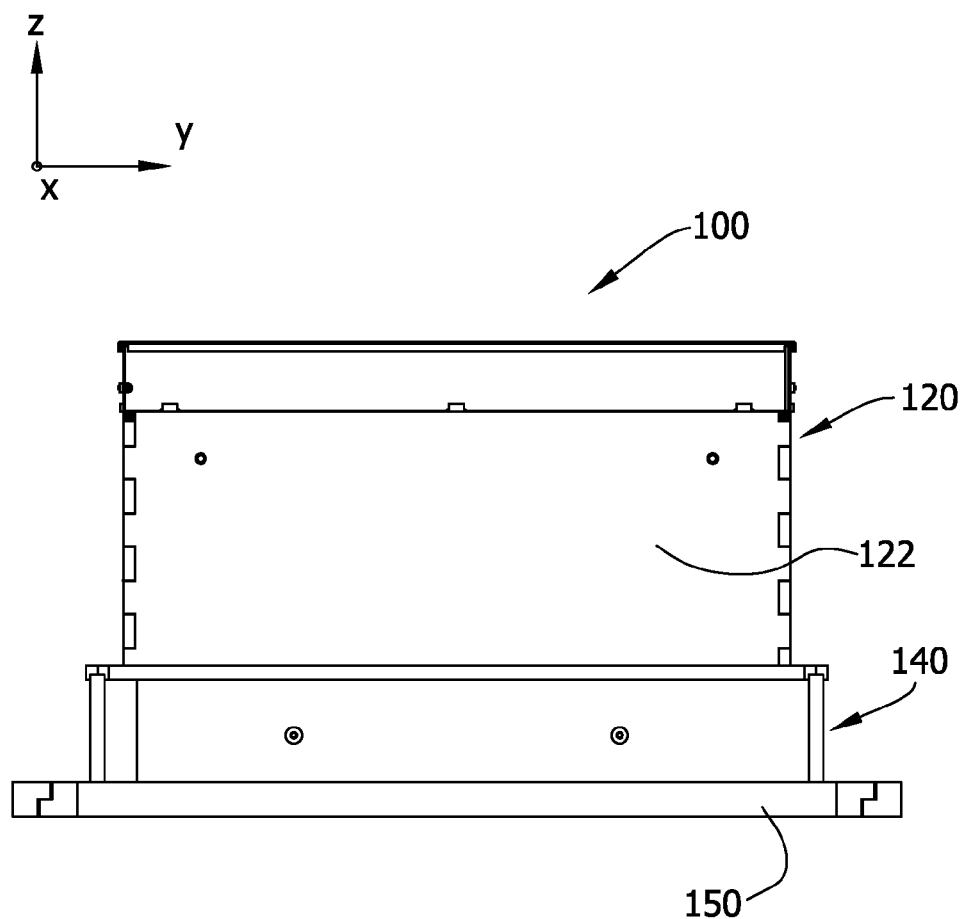
FIG. 2 is side view of FIG. 1.

Referring initially to FIG. 1, a directional solidification furnace is indicated generally at 100. A containment vessel surrounds the furnace 100 in use, but is omitted for clarity. Moreover, heaters and other structures are also omitted for clarity.

A crucible 110 (FIGS. 3 and 4) is disposed within the furnace 100. The crucible 110 has four vertical walls 112 (three of which are shown in the cross-sectional views of FIGS. 3 and 4) connected to a bottom portion 114. The vertical walls 112 and bottom portion 114 are formed from quartz in this embodiment. Each of the vertical walls 112 is supported by a support structure 120 having four vertical walls 122. The support structure 120 also has a bottom plate 124 which supports the bottom portion 114 of the crucible 110. The support structure 120 provides structural rigidity to the crucible 110 and ensures that the crucible does not become deformed during exposure to elevated temperatures within the furnace 100. In some embodiments, the support structure 120 may not have a bottom plate.

The support structure 120 is formed from graphite in the example embodiment, although in other embodiments it may be formed from different materials that are suitably non-reactive at elevated temperatures. While the crucible 110 and support structure 120 in this embodiment are rectangular in shape, other embodiments may use crucibles and/or support structures that are differently shaped.

Figure 3:
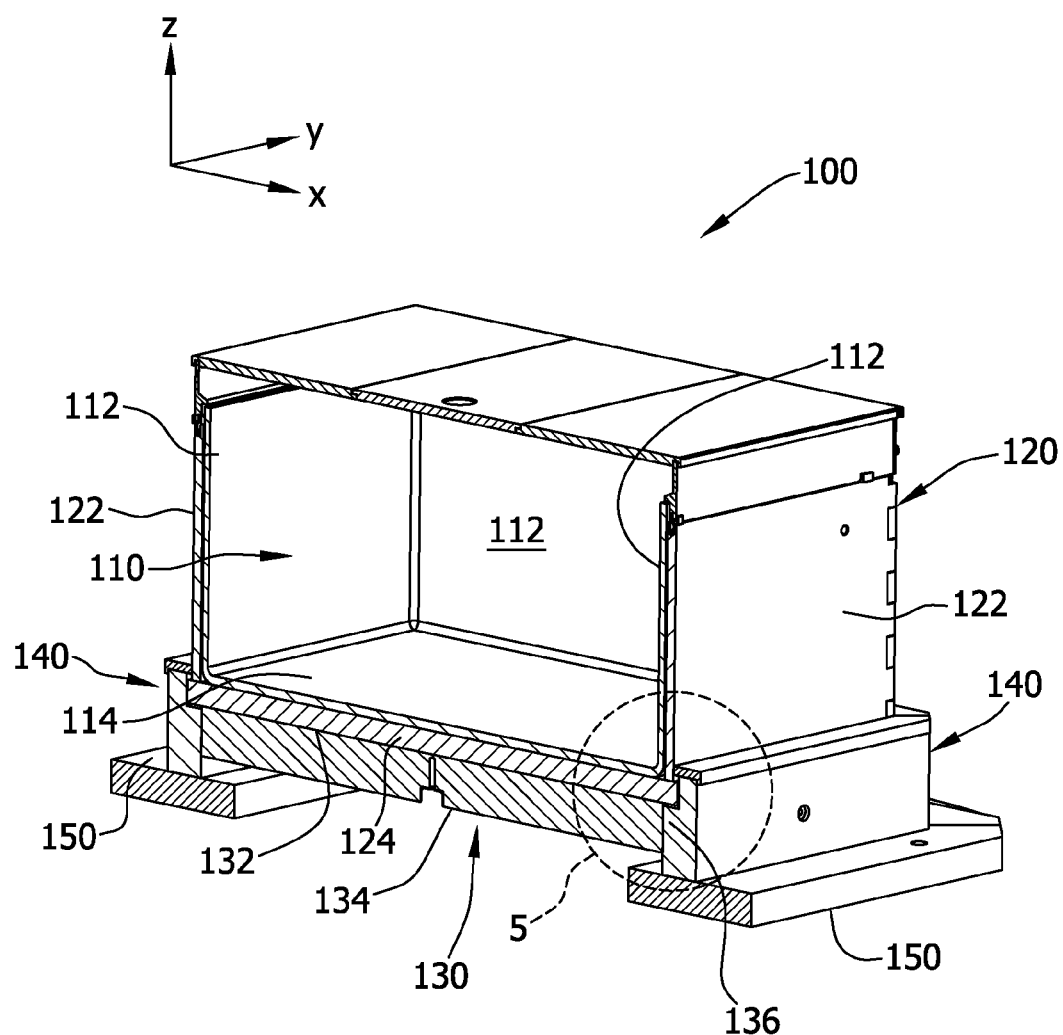
FIG. 3 is a cross-sectional view of FIG. 2 taken along the 3-3 line.
Figure 4:
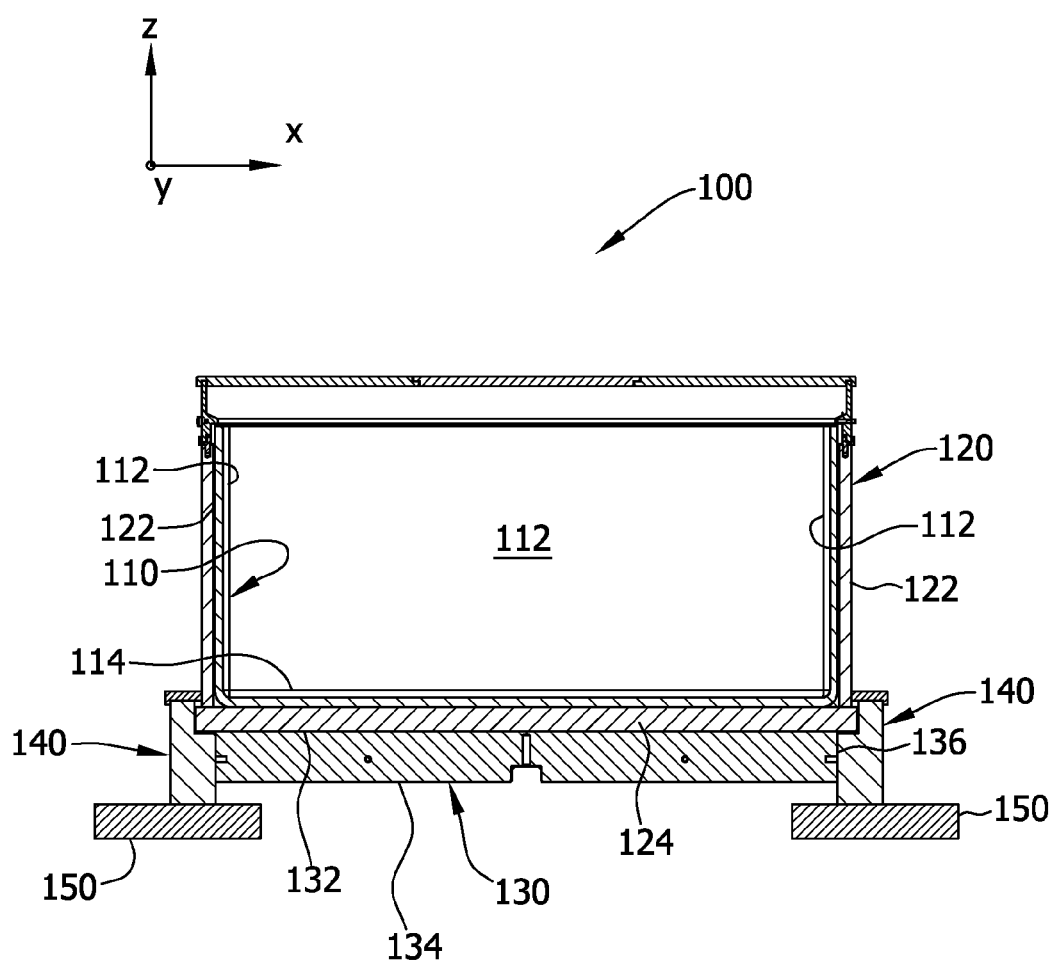
FIG. 4 is a side view of FIG. 3.

The bottom plate 124 of the support structure 120 is disposed atop a hex block 130 (generally, a support member) shown in FIGS. 3 and 4. The hex block 130 and the bottom plate 124 are in thermal communication such that heat can be readily transferred between the block and the plate.

In embodiments where the bottom plate 124 is omitted, the bottom portion 114 of the crucible 110 is disposed atop the hex block 130. The hex block 130 has an upper surface 132 disposed adjacent the bottom plate 124 and an opposing lower surface 134. Lateral sidewalls 136 connect the upper surface 132 and the lower surface 134. In this embodiment, the hex block 130 has a width and a length that are both greater than a width and a length of the bottom plate 124 of the support structure 120. A cooling plate (not shown) may be disposed vertically beneath and adjacent to the lower surface 134 of the hex block 130. Cooling media (e.g., glycol) may be circulated through the cooling plate to aid in the transfer of heat from the hex block 130.

The hex block 130 is formed from a material that readily transfers heat away from the bottom portion of the crucible. Such materials generally have a thermal conductivity k greater than or equal 1.0 W/(m*K). In the example embodiment, the hex block 130 is formed from a material such as graphite that has a thermal conductivity k of greater than about 60 W/(m*K) under typical operating conditions. Other materials may include quartz, carbon fiber composite, aluminum, copper, steel, or alloys thereof. Moreover, the type of material used in the hex block 130 depends on the presence of the bottom plate 124. For example, in systems where the bottom plate 124 is omitted, the hex block 130 may be formed from a material that has greater yield strength than required in systems which use the bottom plate.

Figure 5:
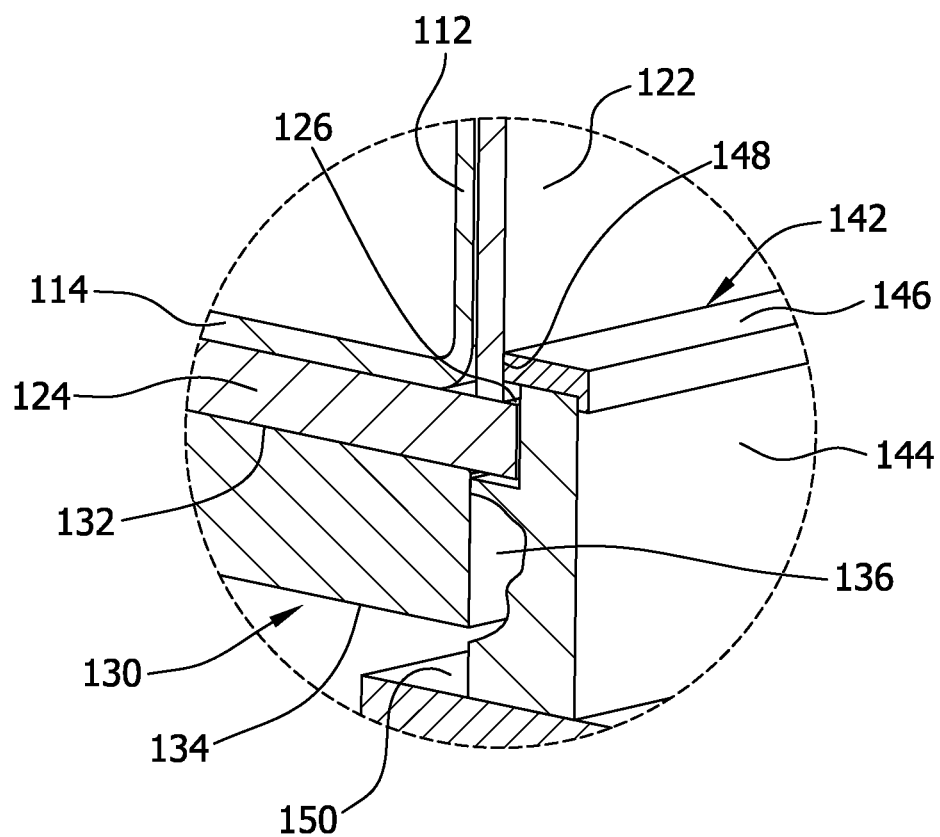
FIG. 5 is an enlarged portion of FIG. 4, with portions omitted for clarity.

Insulation 140 (generally, an insulating member) is disposed adjacent the lateral sidewalls 136 of the hex block 130, as best seen in FIG. 5. The insulation 140 inhibits (i.e., significantly reduces or eliminates) the flow of heat through the lateral sidewalls 136 of the hex block 130. A portion of the insulation 140 is removed in FIG. 5 to show the lateral sidewalls 136 of the hex block 130.

The insulation 140 is comprised of four sections 142 in this embodiment. Each of the sections 142 is positioned adjacent a respective lateral sidewall 136 of the hex block 140. In this embodiment, the sections 142 are in contact with the respective lateral sidewalls 136, although in other embodiments the sections may be spaced from the lateral sidewalls such that there is a gap between the sidewalls and the sections.

As shown in FIGS. 3 and 5, the sections 142 of insulation 140 in this example embodiment have a main portion 144 (broadly, a main insulating member) and a cap portion 146 (broadly, a secondary insulating member or secondary portion). The main portion 144 is positioned atop a support block 150. As shown in FIG. 5, the main portion 144 has a height that is greater than that of the lateral sidewalls 136 of the hex block 130.

An inner side 148 of the cap portion 146 is positioned adjacent to and in contact with the vertical walls 122 of the crucible support 120. The cap portion 146 also ensures that a view factor is not present between the hex block 130 and other components of the furnace 100. The cap portion 146 accomplishes this by shielding a segment 126 (FIG. 5) of the bottom plate 124 of the support structure 120 that extends outward from the bottom plate beyond the vertical walls 122.

In the example embodiment, the portions 144, 146 are regions of the same section 142 of insulation 140 and are thus a continuous structure. In other embodiments, they are separate structures that are connected together to form the section 142 of insulation 140. The main portion 144 is generally parallel to the lateral sidewalls 136 of the hex block 130 and has a height greater than the lateral sidewalls. The cap portion 146 is disposed atop the main portion 144 and is generally perpendicular to the main portion.

According to one embodiment, the main portions 144 of the insulation 140 are movable between two positions. In the first position, the main portions 144 are in contact with the lateral sidewalls 136 of the hex block 130 (as shown in FIG. 5). The main portions 144 are not in contact with the lateral sidewalls 136 in the second position. The cap portions 146 are likewise movable between a first position where they are in contact with the vertical walls 122 of the support structure 120 (FIG. 5) and a second position where the portions are not in contact with vertical walls. In the example embodiment where the portions 144, 146 are made of one section 142 of insulation 140, the one section of insulation moves between the positions in unison. However, in other embodiments where the portions 144, 146 are separate structures, the portions are capable of moving between the positions independently of each other.

The portions 144, 146 are moved between the first position and the second position by a suitable actuator (not shown). All of the portions 144, 146 can be moved in unison by the actuator, or the portions can be moved separately by the actuator.

In use, the portions 144, 146 of the insulation 140 are positioned in the first (solidification) position after the silicon in the crucible 110 has been melted and is being cooled to solidify it into an ingot. The portions 144, 146 are positioned in the second (melt) position while the silicon within the crucible 110 is melted. When in the second position, heat generated by the heaters within the furnace 100 can be transferred through the lateral sidewalls 136 of the hex block 130 and eventually into the silicon within the crucible 110. This additional heat transferred through the lateral sidewalls 136 of the hex block 130 results in a reduction in the amount of time required to melt the silicon. The portions 144, 146 are then moved to the first position during solidification of the molten silicon.

The insulation 140 described herein inhibits the flow of heat through the lateral sidewalls 136 of the hex block 130 such that the substantially all of the heat is forced to exit the hex block 130 through its lower surface 134. In prior systems without such insulation, a substantial portion of the heat also exited the hex block 130 through the lateral sidewalls 136. Accordingly, for a given horizontal plane in the melt, heat was transferred from the melt at an increased rate nearest the lateral sidewalls 136. This increased rate was greater than the heat transfer rate within the same plane of the melt at other locations nearer the center of the hex block 130. Portions of the melt nearest the lateral sidewalls 136 of the crucible 130 thus began to solidify sooner than portions of the melt disposed nearer the center of the hex block 130. Accordingly, such differential heat transfer often resulted in the differential solidification of the melt within the same horizontal plane.

The embodiments described herein significantly reduce or eliminate this differential heat transfer within the same horizontal plane of the melt. The insulation 140 disposed adjacent the hex block 130 and support structure 120 inhibits or eliminates the flow of heat through the lateral sidewalls 136 of the hex block. Substantially all of the heat which flows from the melt into the hex block 130 exits the block through its lower surface 134. Accordingly, heat flows at a uniform rate across the horizontal plane in the melt since heat transferred through the sidewalls 136 of the hex block 130 is greatly reduced and/or eliminated. This uniform rate of heat transfer is one-dimensional and results in the uniform solidification of the melt throughout the horizontal plane.

While the invention has been described in terms of various specific embodiments, it will be recognized that the invention can be practiced with modification within the spirit and scope of the claims.

When introducing elements of the present disclosure or the embodiments thereof, the articles "a", "an", "the" and "said" are intended to mean that there are one or more of the elements. The terms "comprising", "including" and "having" are intended to be inclusive and mean that there may be additional elements other than the listed elements. The use of terms indicating a particular orientation (e.g., "top", "bottom", "side", etc.) is for convenience of description and does not require any particular orientation of the item described.

As various changes could be made in the above constructions and methods without departing from the scope of the invention, it is intended that all matter contained in the above description and shown in the accompanying drawings shall be interpreted as illustrative and not in a limiting sense.

What is claimed is:

1. A directional solidification furnace comprising:
   a crucible for holding molten silicon;
   a crucible support having vertical walls and a bottom plate for supporting the crucible, the bottom plate having an underside surface that defines a lower area;
   a support member having an upper surface and a lower surface connected along their respective peripheries by lateral sidewalls, the underside surface of the crucible support positioned adjacent the upper surface of the support member, the upper surface of the support member defining an upper area that is substantially smaller than the lower area of the bottom plate such that the bottom plate extends outward past the lateral sidewalls of the support member; and
   an insulating member disposed adjacent the lateral sidewalls of the support member to inhibit heat from exiting laterally therethrough, the insulating member having a recess to accept at least a portion of the bottom plate therein, the insulating member extending above the bottom plate and below the support member, wherein the insulating member has a main portion generally parallel to the lateral sidewalls of the support member and a cap portion generally perpendicular to the main portion, the cap portion extending from the vertical sidewall of the crucible support to a location outward of the main portion.

2. The furnace of claim 1, wherein the insulation member is positionable between a first position and a second position, the insulation member being in contact with the lateral sidewalls of the support member when in the first position.

3. The furnace of claim 2, wherein the insulation member is not in contact with the lateral sidewalls of the support member when in the second position.

4. The furnace of claim 1, wherein the cap portion includes a downward boss that extends below a top surface of the main portion to create a tortuous path from inward of the main portion to outward of the cap portion.

5. A directional solidification furnace comprising:
   a crucible for holding molten silicon;
   a crucible support having vertical walls and a bottom plate for supporting the crucible, the bottom plate having an underside surface that defines a lower area;
   a support member having an upper surface and a lower surface connected along their respective peripheries by lateral sidewalls, the underside surface of the crucible support positioned adjacent the upper surface of the support member, the upper surface of the support member defining an upper area that is substantially smaller than the lower area of the bottom plate such that the bottom plate extends outward past the lateral sidewalls of the support member; and
   an insulating member disposed adjacent the lateral sidewalls of the support member to inhibit heat from exiting laterally therethrough, the insulating member having a recess to accept at least a portion of the bottom plate therein, the insulating member extending above the bottom plate and below the support member, wherein the insulating member has a main portion generally parallel to the lateral sidewalls of the support member and a cap portion generally perpendicular to the main portion, the cap portion including a downward boss that extends below a top surface of the main portion to create a tortuous path from inward of the main portion to outward of the cap portion.

6. The furnace of claim 5, wherein the insulation is in contact with the lateral sidewalls of the support member and the vertical wall of the crucible support.

7. The furnace of claim 5, wherein the recess in the insulating member provides a tortuous path between the support member and an area outside of the insulation.

8. The furnace of claim 5, wherein the insulating member comprises a plurality of sections, each of the plurality of sections positioned adjacent a respective lateral sidewall of the support member.

9. The furnace of claim 8, wherein each of the plurality of sections of the insulating member is in contact with the respective lateral sidewall of the support member.

10. The furnace of claim 5, wherein the cap portion is in contact with the vertical sidewall of the crucible support.

11. The furnace of claim 5, wherein the cap portion extends from the vertical sidewall of the crucible support to a location outward of the main portion.

12. A directional solidification furnace comprising:
a crucible for holding molten silicon;
a crucible support including a vertical wall and a bottom plate for supporting the crucible;
a support member having an upper surface and a lower surface connected along their respective peripheries by lateral sidewalls, the bottom plate is positioned adjacent the upper surface of the support member;
a main insulating member removably positioned adjacent to and surrounding the lateral sidewalls of the support member; and
a cap insulating member removably positioned on top the main insulating member and adjacent the vertical wall of the crucible support, the cap extending from the vertical wall outward to a point outward of the main insulating member.

13. The furnace of claim 12, wherein the main insulating member is in contact with the lateral sidewalls of the support member.

14. The furnace of claim 12, wherein at least a portion of the cap insulating member extends downward below the top of the main insulating member.

15. The furnace of claim 12, wherein the main insulating member is movable between a first main position of being in contact with the lateral sidewalls of the support member and a second main position of being disposed away from the lateral sidewalls of the support member.

16. The furnace of claim 12, wherein the cap insulating member is movable between a first cap position of being in contact with the vertical wall of the crucible support and a second cap position of being disposed away from the crucible support.

* * * * *